(12) United States Patent
Yagi

(10) Patent No.: US 9,097,945 B2
(45) Date of Patent: Aug. 4, 2015

(54) DISPLAY DEVICE AND ELECTRONIC UNIT

(75) Inventor: Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 454 days.

(21) Appl. No.: 13/546,719

(22) Filed: Jul. 11, 2012

(65) Prior Publication Data

US 2013/0038581 A1 Feb. 14, 2013

(30) Foreign Application Priority Data

Aug. 11, 2011 (JP) ................................. 2011-175832

(51) Int. Cl.
*G06F 3/038* (2013.01)
*G09G 5/00* (2006.01)
*G02F 1/1345* (2006.01)

(52) U.S. Cl.
CPC .......... *G02F 1/1345* (2013.01); *G02F 1/13452* (2013.01); *G02F 2201/42* (2013.01)

(58) Field of Classification Search
CPC .. G09G 3/3648; G09G 3/3614; G09G 3/3688
USPC ................ 345/76–83, 204; 315/169.1–169.4; 313/343, 396, 498, 500, 506
See application file for complete search history.

(56) References Cited

U.S. PATENT DOCUMENTS

| 7,557,779 | B2 * | 7/2009 | Tanada | 345/76 |
| 8,217,864 | B2 * | 7/2012 | Tanada | 345/76 |
| 8,446,348 | B2 * | 5/2013 | Tanada | 345/76 |
| 8,749,461 | B2 * | 6/2014 | Tanada | 345/82 |

FOREIGN PATENT DOCUMENTS

| JP | 06-148671 | 5/1994 |
| JP | 2006-003741 | 1/2006 |
| JP | 2010-266849 | 11/2010 |

* cited by examiner

*Primary Examiner* — Kimnhung Nguyen
(74) *Attorney, Agent, or Firm* — Fishman Stewart Yamaguchi PLLC

(57) ABSTRACT

A display device includes: a substrate including a display region and a peripheral region; a first wiring provided on a front face of the substrate; and a second wiring provided on a rear face of the substrate and electrically connected to the first wiring.

18 Claims, 15 Drawing Sheets

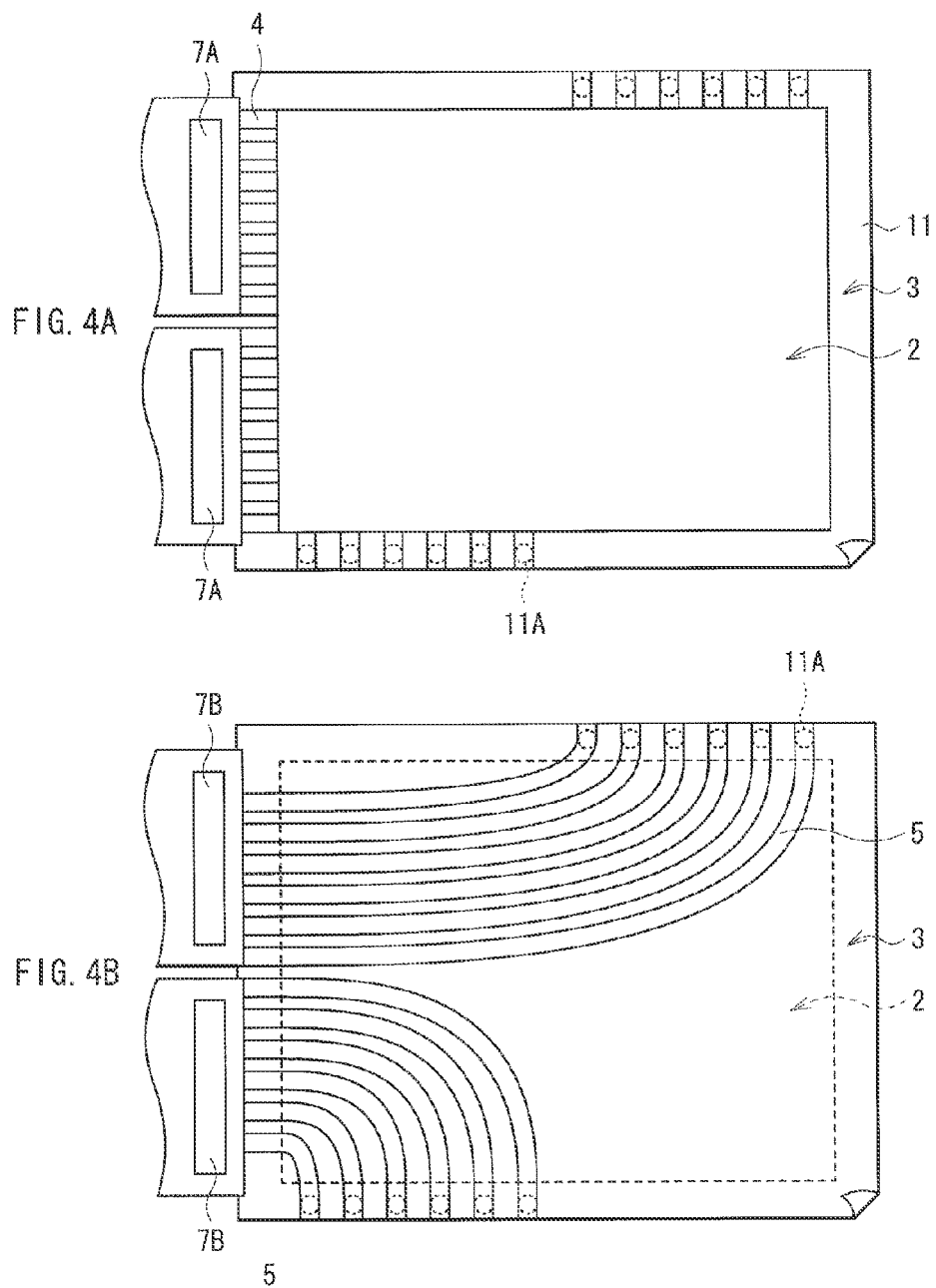

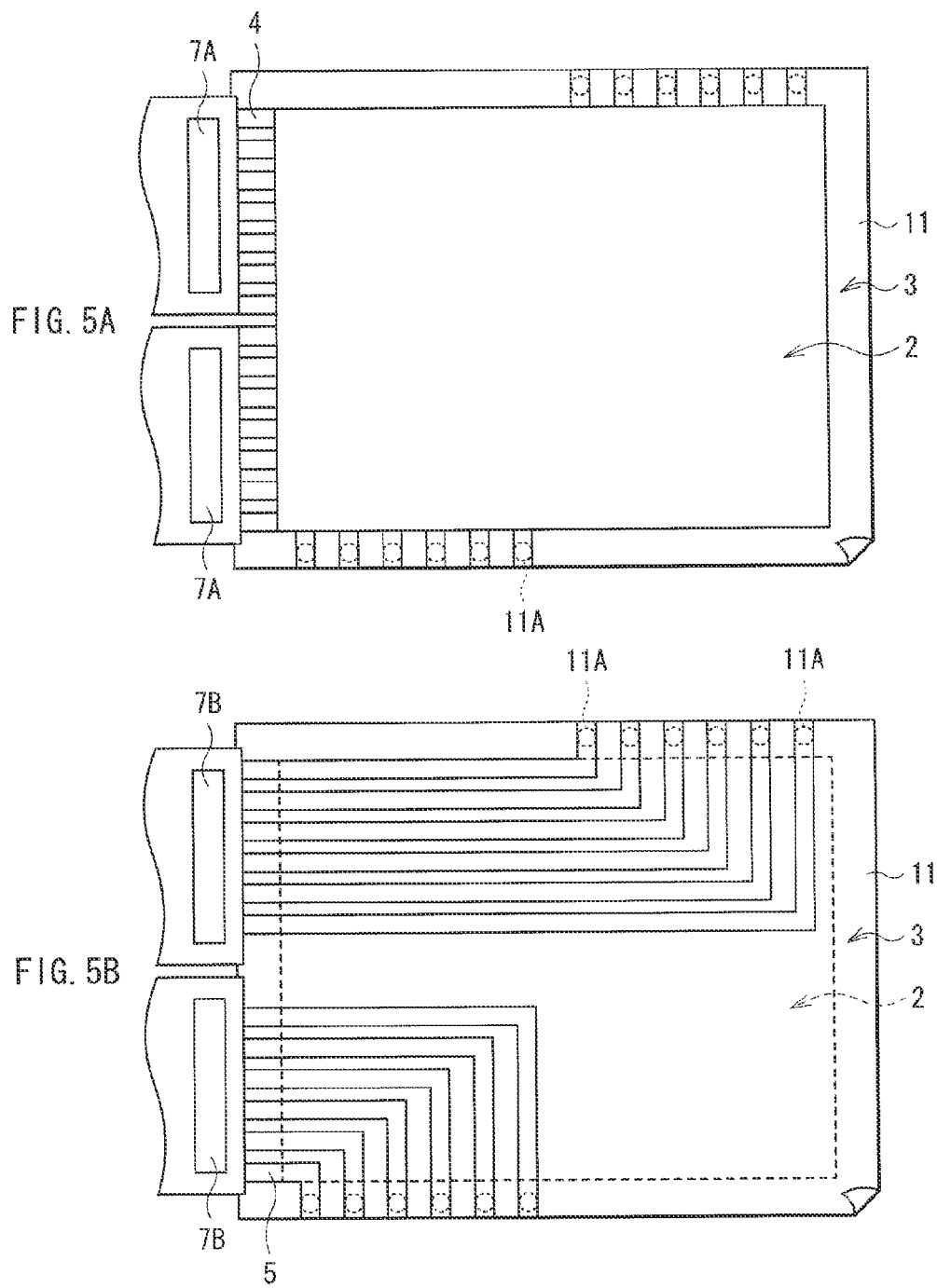

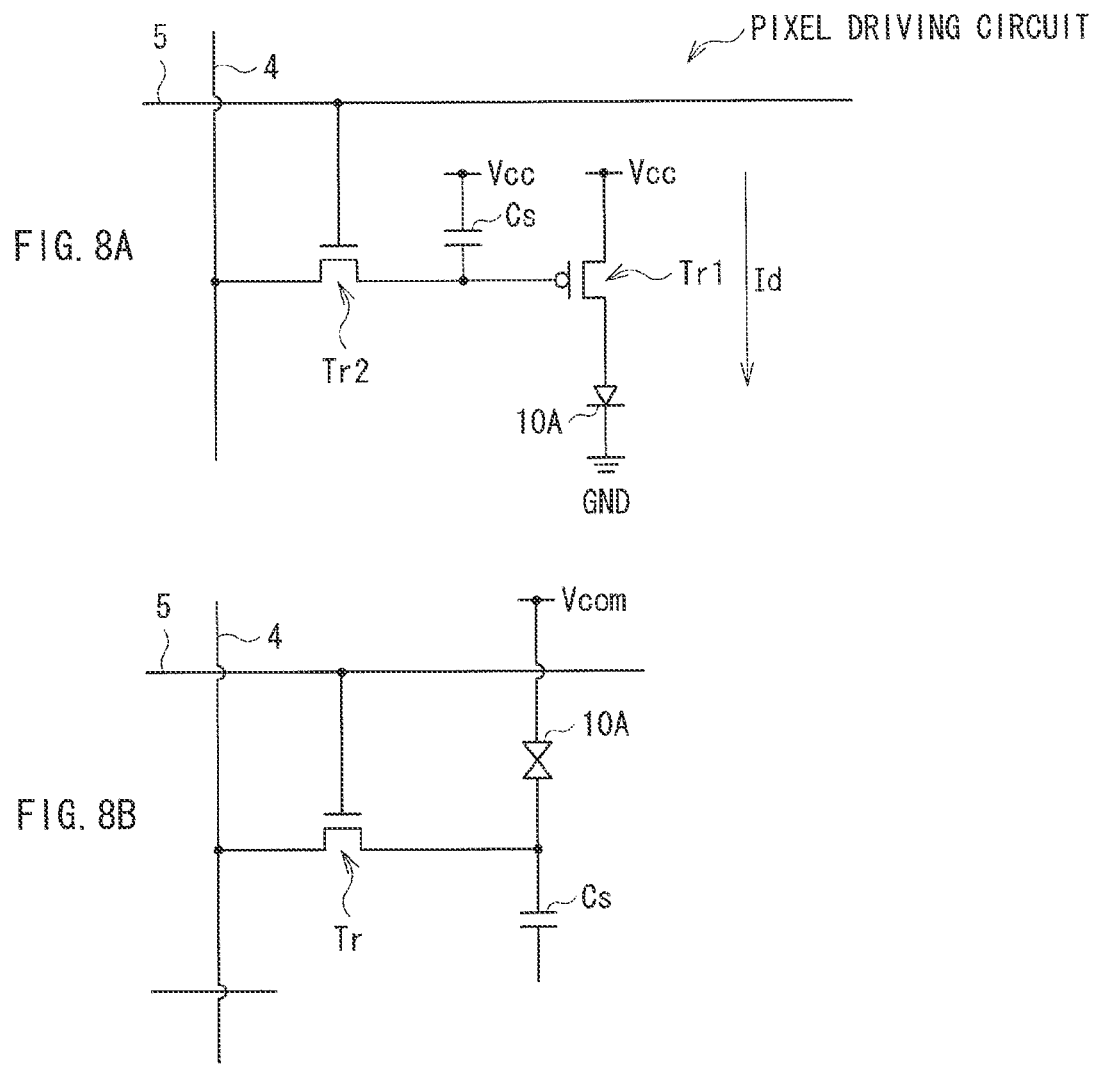

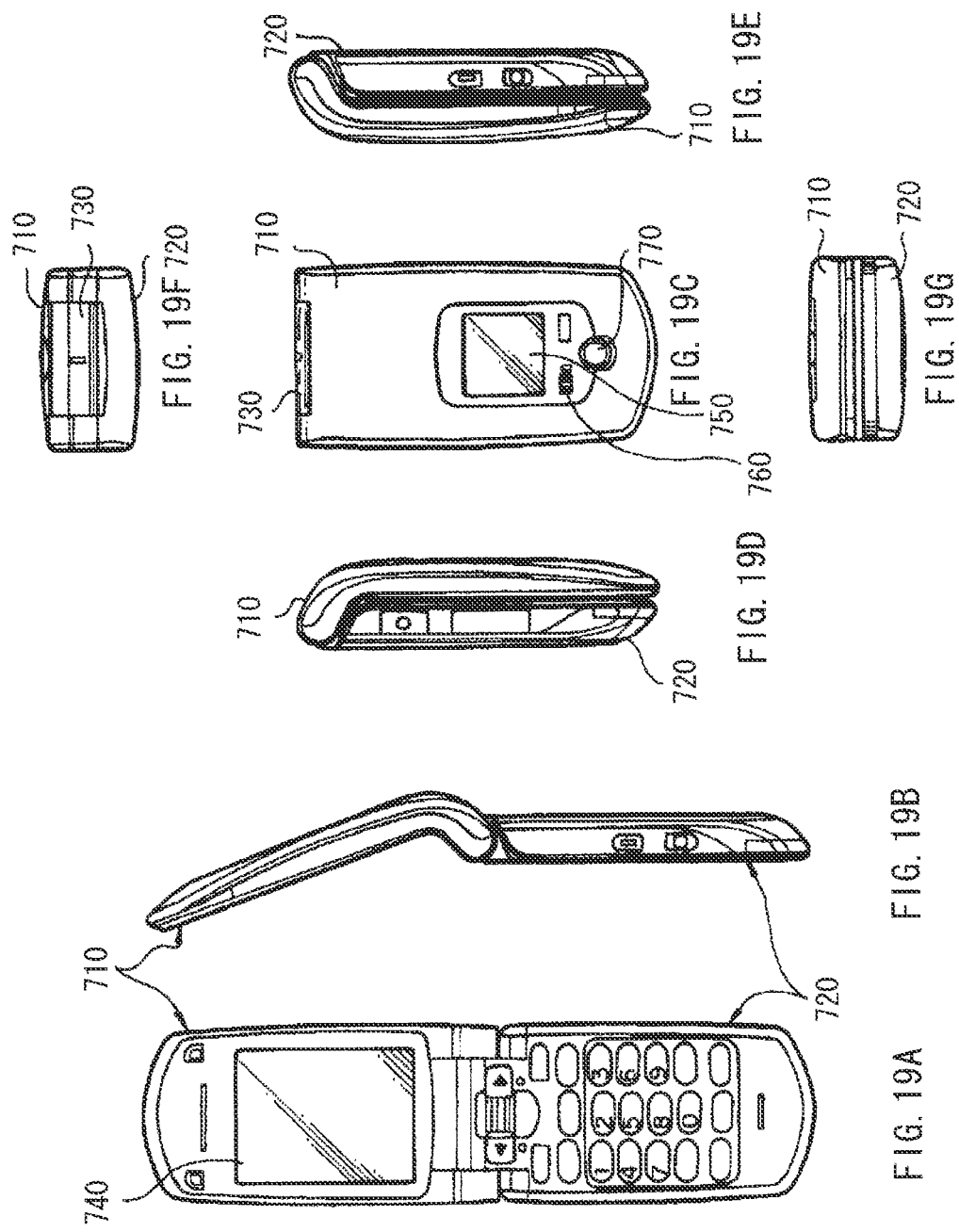

DISPLAY DEVICE AND ELECTRONIC UNIT

BACKGROUND

The present technology relates to a display device provided with a flexible printed substrate and the like on the outside of a display, and an electronic unit provided with the display device.

Flat type display devices such as liquid crystal display devices and electrophoretic display devices are typically provided with a plurality of display elements disposed in matrix in a display region, and a plurality of wirings (signal lines and scan lines) disposed in a row direction and a column direction to control the display elements. In a display device having a rectangular shape for example, such wirings are pulled out from a side corresponding to the extending direction of the wirings. In this case, on the outside of a display panel, for example, a driver IC (integrated circuit) and a flexible printed substrate (FPC) are connected to the wirings, and a drive signal is supplied therefrom.

As methods for simplifying the wirings, for example, chip mounting for directly mounting a driver IC and the like to a display panel, and mixed driver mounting for mounting a built-in circuit such as a driver in a non-display region on a display panel are disclosed (for example, see Japanese Unexamined Patent Application Publication Nos. 2006-3741, H6-148671, and 2010-266849). According to these methods, the number of wirings pulled out to the outside of a display panel is reduced, and wirings formed in the non-display region may be simplified.

SUMMARY

However, in the above-mentioned methods, as the number of wirings in a display region increases, the number of wirings pulled out to the outside from the driver IC and the built-in circuit mounted on the display panel is increased. For this reason, a peripheral region may be expanded.

It is desirable to provide a display device which offers greater degree of freedom for wiring design and allows simplified wiring, and an electronic unit including the display device.

A display device according to an embodiment of the present technology includes: a substrate including a display region and a peripheral region; a first wiring provided on a front face of the substrate; and a second wiring provided on a rear face of the substrate and electrically connected to the first wiring.

An electronic unit according to the embodiment of the present technology includes a display device. The display device includes: a substrate including a display region and a peripheral region; a first wiring provided on a front face of the substrate; and a second wiring provided on a rear face of the substrate and electrically connected to the first wiring.

In the display device and the electronic unit according to the embodiments of the present technology, the first wiring and the second wiring are provided on the front face and the rear face of the substrate, respectively, and are electrically connected to each other. Consequently, the degree of freedom of design of the wiring formed in the peripheral region of the substrate is improved.

According to the display device and the electronic unit of the embodiment of the present technology, since the second wiring is provided on the rear face of the substrate, and the second wiring and the first wiring which is provided on the front face of the substrate are electrically connected to each other, it is possible to improve the degree of freedom of design of the wiring formed in the peripheral region of the substrate, and to simplify the wiring provided in the periphery of the display region.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 4A and 4B are plan views each showing another example of a display device according to an embodiment of the present disclosure.

FIGS. 5A and 5B are plan views each showing another example of a display device according to an embodiment of the present disclosure.

FIGS. 8A and 8B are diagrams each showing an example of a pixel driving circuit illustrated in FIG. 3.

FIG. 19A is a front elevational view of application example 6 in an unfolded state, FIG. 19B is a side view thereof, FIG. 19C is a front elevational view in a folded state, FIG. 19D is a left side view, FIG. 19E is a right side view, FIG. 19F is a top view, and FIG. 19G is a bottom view.

DETAILED DESCRIPTION

Referring to the figures, an embodiment of the present disclosure will be described in detail. It is to be noted that description will be given in the following order.

Figure 1:
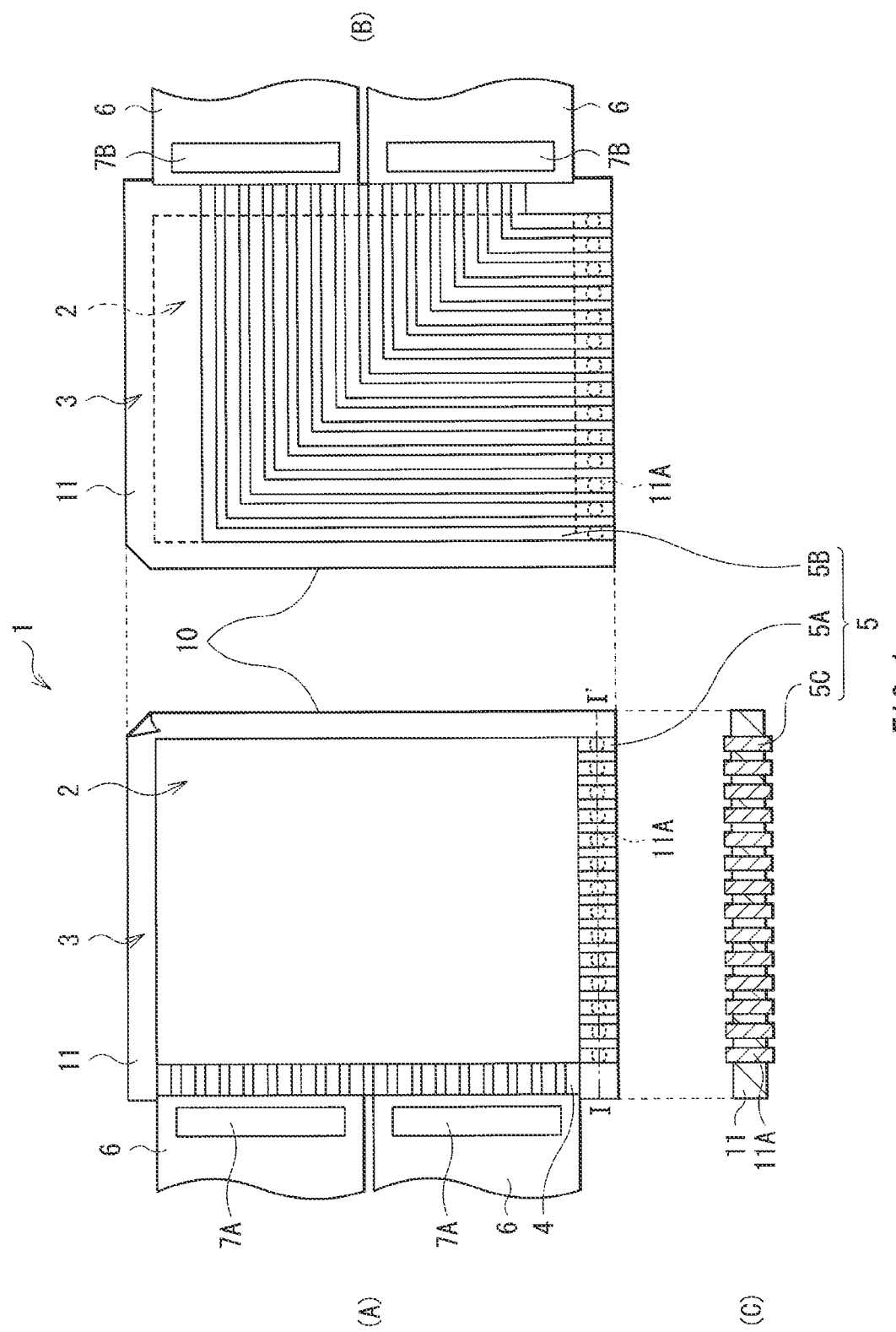
FIG. 1 is a plan view and a sectional view each showing a configuration of a display device according to an embodiment of the present disclosure.

1. Embodiment
   A display device in which wirings formed on a front face and wirings formed on a rear face of a substrate are electrically joined together via through holes.
   (1-1) General Configuration
   (1-2) Manufacturing Method
2. Application Examples 1. Embodiment (1-1) General Configuration FIG. 1 shows a plan configuration and a cross-sectional configuration of a front face and a rear face of a display device (display device 1) according to an embodiment of the present disclosure. (A) of FIG. 1 shows a plan configuration as viewed from a front side (display side), (B) of FIG. 1 shows a plan configuration as viewed from a rear side, and (C) of FIG. 1 shows a cross-sectional configuration of a peripheral region 3 taken along a dashed line I-I' in (A) of FIG. 1. The display device 1 is, for example, an organic EL (electro luminescence) television which utilizes the organic EL phenomenon to emit light, or an electrophoretic display (so-called electronic paper display) which utilizes the electrophoresis phenomenon to display an image (such as letter information). A display panel 10 of the display device 1 includes, on a substrate 11, a display region 2 in which a plurality of pixels 10A (see FIG. 3) are disposed in matrix, and a peripheral region 3, for example. In the peripheral region 3, there are provided wirings (signal lines 4 (third wirings) and scan lines 5A (first wirings)) through which a drive signal is supplied to each pixel 10A from a signal line driving circuit 7A and a scan line driving circuit 7B which are provided on the outside of the display panel 10 to serve as drivers for image display. It is to be noted that (A) to (C) of FIG. 1 are views schematically showing the structure of the display device 1, and differ from actual dimension and form.

Figure 2:
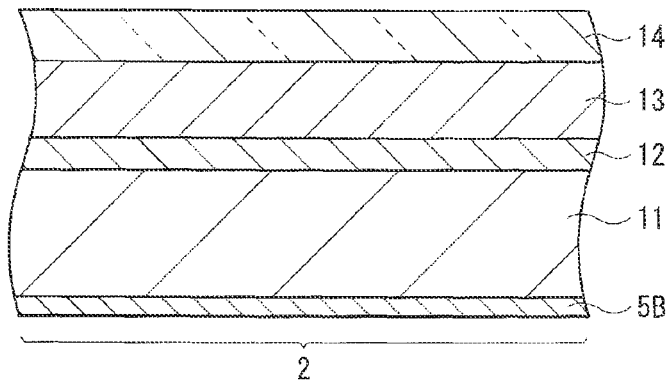
FIG. 2 is a sectional view showing a configuration of a part of the display device illustrated in FIG. 1.
Figure 3:
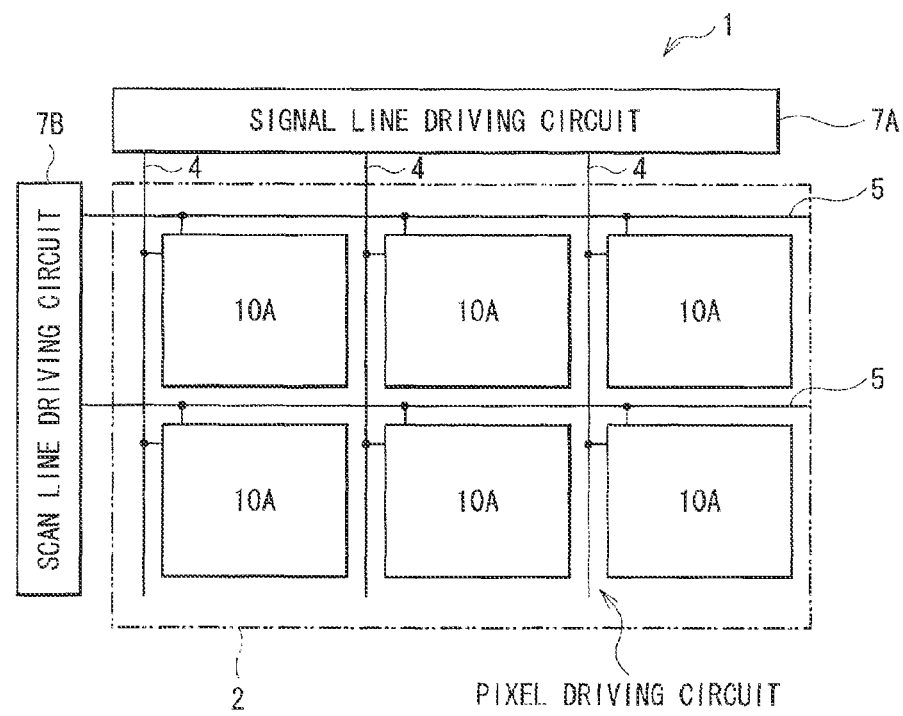
FIG. 3 is a configuration diagram of a display region and a peripheral region illustrated in FIG. 1.

FIG. 2 shows a part of a cross-sectional configuration of the display region 2. As illustrated in FIG. 2, in the display region 2, a TFT layer 12, a display layer 13, and a transparent substrate 14 are laminated on the substrate 11 in this order. FIG. 3 shows a schematic configuration of the display device 1.

The substrate 11 (display substrate) has, for example, a rectangular shape, and on a center portion of the top face thereof, the TFT layer 12, the display layer 13, and the transparent substrate 14 are laminated in this order to form the display region 2. On the other hand, a region of the substrate 11 which surrounds the display region 2 is the peripheral region 3 (non-display region). The substrate 11 is made of an inorganic material such as glass, quartz, silicon, and gallium arsenide, or a plastic material such as polyimide, polyethylene terephthalate (PET), polyethylene naphthalate (PEN), polymethyl methacrylate (PMMA), polycarbonate (PC), polyether sulfone (PES), poly ethyl ether ketone (PEEK), and aromatic polyester (liquid crystal polymer). The substrate 11 may be configured either of a rigid substrate such as a wafer, or a flexible substrate such as a thin layer glass and a film. When the substrate 11 is configured of a flexible substrate, a bendable display device is realized.

The substrate 11 is provided with through holes 11A each having a size of several tens of microns in diameter. It is preferable to provide the through holes 11A in the peripheral region 3 to prevent the display layer 13 and the like from being influenced. Specifically, the through holes 11A are provided at one side of the peripheral region 3 of the display panel 10 having a rectangular shape. For example, the through holes 11A are provided at one side of the peripheral region 3 from which front face wiring described later (the signal lines 4 and the scan lines 5A) are pulled out. The through holes 11A are filled with a material similar to that of a front face wiring layer and a rear face wiring layer described later to form penetrating electrodes 5C.

The TFT layer 12 has a laminated structure containing a plurality of devices including a thin film (a metal layer such as an electrode, an insulating film, and the like), and as mentioned above, the TFT layer 12 is disposed at a center portion (the display region 2) of the substrate 11. Specifically, examples of the devices include a transistor (TFT; thin film transistor) as a switching device for selecting pixels, a capacitive device (holding capacitive device and the like), the front face wiring layer (the signal lines 4, the scan lines 5A, and the like) serving as a pixel driving circuit (FIG. 3), and an electrode (pixel electrode and the like). It is to be noted that, the TFT may be either of an organic TFT using an organic semiconductor layer or an inorganic TFT using an inorganic semiconductor layer as a channel layer. In addition, the configuration thereof is not specifically limited, and may be either of an inversely-staggered structure (so-called bottom-gate type) or a staggered structure (top-gate type), for example.

It is to be noted that, a barrier layer (not illustrated) may be provided between the substrate 11 and the TFT layer 12 to prevent degradation due to water or organic gas infiltrated into the TFT layer 12 and the display layer 13. The barrier layer is made of, for example, silicon oxide ($SiO_2$), silicon nitride ($Si_3N_4$), aluminum oxide ($Al_2O_3$), aluminum nitride (AlN), tantalum oxide ($Ta_2O_5$), or aluminum oxynitride ($AlO_xN_{1-x}$ (note that, X=0.01 to 0.2)).

The display layer 13 is, for example, an organic EL device including an organic light emitting layer provided between a pixel electrode and a common electrode. The pixel electrode is provided in the TFT layer 12 for each pixel, and the common electrode is provided over the entire surface of the transparent substrate 14 provided on the display layer 13. It is to be noted that, the display layer 13 is not limited to the organic EL device, and may be an electrophoretic device including an electrophoretic layer as a light emitting layer.

The transparent substrate 14 may be made of a material similar to that of the substrate 11. Further, a moisture-proof film intended to prevent water from infiltrating into the display layer 13 and an optical functional film intended to prevent external light from being reflected in a display face may be provided on the transparent substrate 14.

The rear face wiring layer (second wiring), which is a part of the pixel driving circuit, is provided on the rear face side of the substrate 11, and is electrically connected to the front face wiring formed in the TFT layer 12 through the penetrating electrode 5C formed in the peripheral region 3 of the substrate 11. In the present embodiment, the rear face wiring layer is a part of scan lines 5, and is scan lines 5B connected to the scan lines 5A provided on the front face of the substrate 11 through the penetrating electrode 5C. As illustrated in (B) of FIG. 1, the scan lines 5B are extended in a long axis direction of the substrate 11, and then are bent in a short axis direction at a predetermined position so as to be pulled out in the same direction as the direction that the signal lines 4 provided on the front face of the substrate 11 are pulled out to the outside.

Figure 6A:
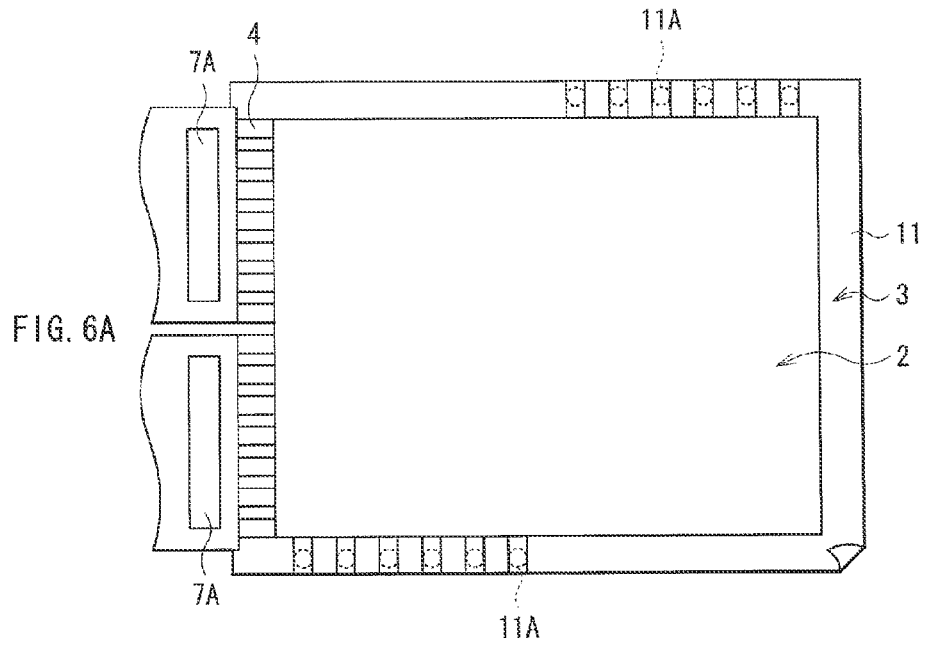
FIGS. 6A and 6B are plan views each showing another example of a display device according to an embodiment of the present disclosure.
Figure 6B:
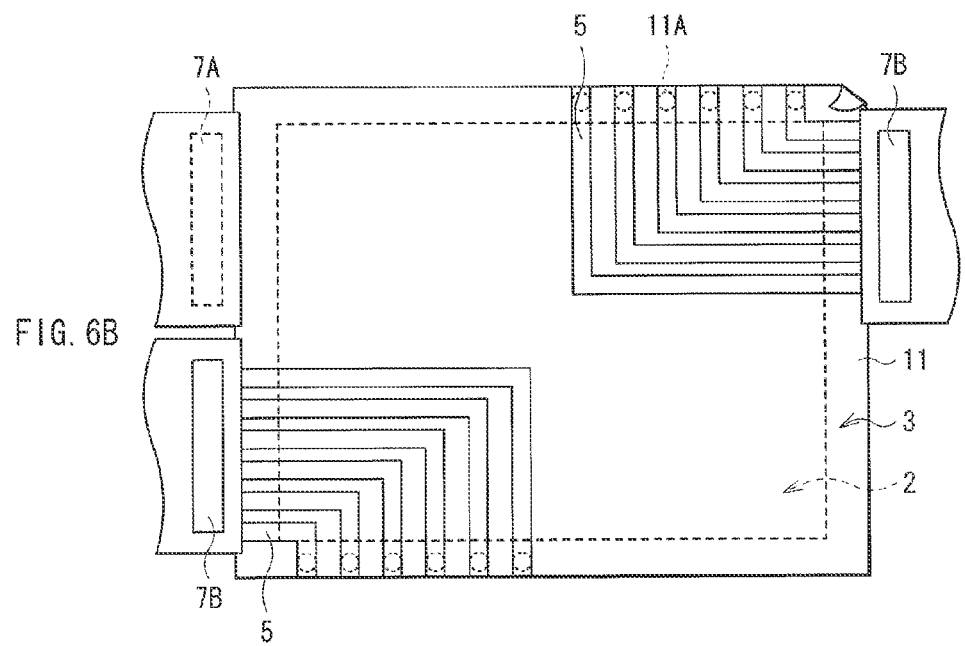
Figure 7A:
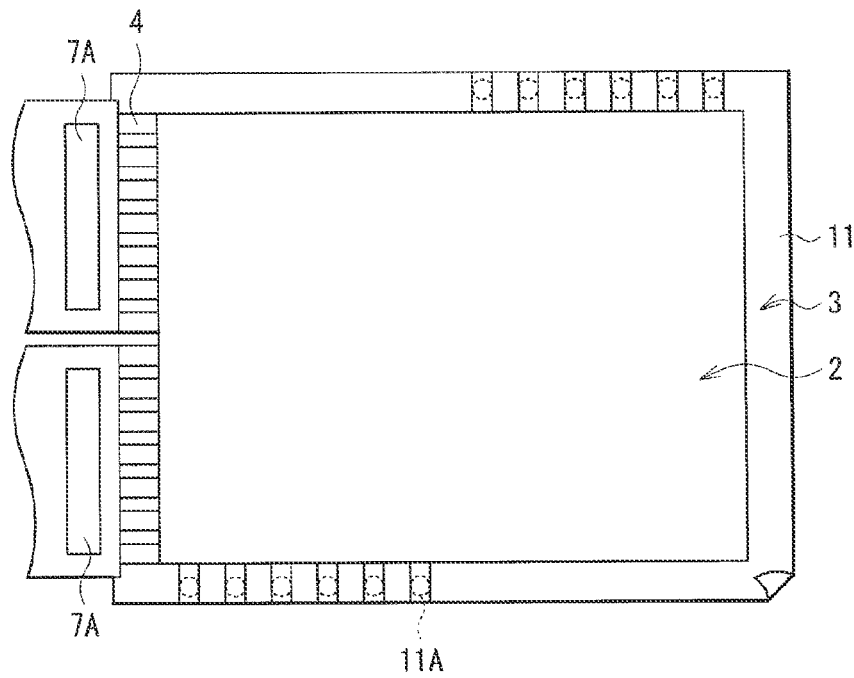
FIGS. 7A and 7B are plan views each showing another example of a display device according to an embodiment of the present disclosure.
Figure 7B:
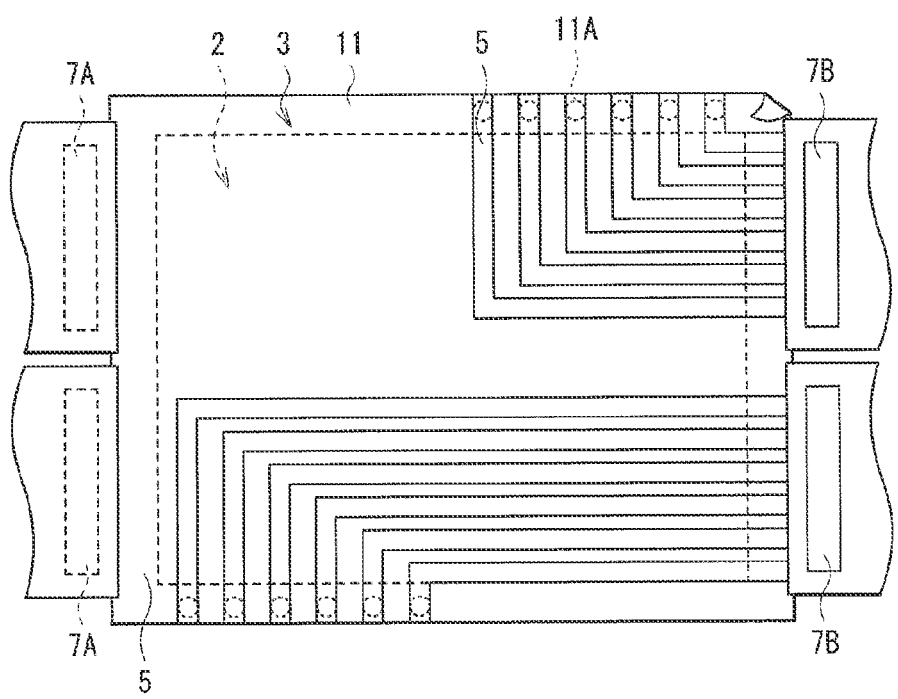

It is to be noted that, while the scan lines 5 are laid out on the rear face of the substrate 11 in this instance, this is not limitative, and it is also possible to lay out the signal lines 4 on the rear face side. In the case where the wiring i in a short side direction in which the number of the wiring is small (here, the scan lines 5A) is laid out by the rear face wiring as in the present embodiment, since the number of gate lines is small, the manufacturing process is simplified. On the other hand, in the case where the wiring in a long side direction (here, the signal lines 4) is laid out by the rear face wiring, a driver IC such as the signal line driving circuit 7A and the scan line driving circuit 7B, and a flexible printed substrate (FPC) or the like on which the driver IC is mounted may be connected at a wiring pull out section formed in the short side direction. Hence, the degree of freedom for a layout of the wiring is improved. Further, in the case where a flexible substrate is used as the substrate 11, a member vulnerable to bending such as a connection portion connected to a driver IC and a flexible printed substrate may be put together in the short side direction, and thus the flexibility of the display device is further improved. In addition, in the present embodiment, the scan lines 5B are laid out to be bent at a predetermined position, however, this is not limitative. For example, as illustrated in FIGS. 4A and 4B, the scan lines 5B may be laid out in a curved line shape, and as illustrated in FIGS. 5A and 5B, the scan lines 5B may also be laid out in a line shape composed of a plurality of line segments. In addition, the front face wiring and the rear face wiring are not necessarily pulled out from the same side, and as illustrated in FIGS. 6A and 6B, for example, it is possible to pull out half of the rear face wirings from the side same as that of the front face wirings, and pull out the remaining rear face wirings from the side opposite to the side from which the front face wirings are pulled out. Further, the signal lines 4 and the scan lines 5A are not necessarily pulled out from the same side, and as illustrated in FIGS. 7A and 7B for example, they may be pulled out from the sides opposite to each other. It is to be noted that, as illustrated in FIG. 1 and FIG. 4A to FIG. 7B, by pulling out the front face wiring and the rear face wiring from the same side or from the sides opposite to each other, the flexibility of the display device manufactured with use of a flexible substrate is improved.

Further, while, in the present embodiment, the front face wiring and the rear face wiring are connected via the connecting section configured of the through holes 11A, it suffices to electrically connect the front face wiring and the rear face wiring. For example, in addition to the through holes 11A, it is possible to extend the front face wiring and the rear face wiring to the edge of the substrate 11 so that the front face wiring and the rear face wiring are connected to each other via the side face of the substrate 11. It should be noted that, when the connection is established via the through holes 11A as in the present embodiment, it is possible to prevent flaws such as a disconnection at the connecting section. Additionally, it is also possible to provide another connecting section (not shown) intended to connect the front face wiring and the rear face wiring with use of a separately provided flexible printed wiring substrate. It should be noted that, when the connection is established via the through holes 11A as in the present embodiment, the number of components is decreased.

In addition, each of the above-mentioned front face wiring layer (the signal lines 4 and the scan lines 5A), the rear face wiring layer (the scan lines 5B), and the penetrating electrode 5C is configured of a single layer film made of one of generally used conductive materials, such as molybdenum (Mo), chromium (Cr), tantalum (Ta), titanium (Ti), transparent materials such as In alloys including ITO, IGO, and IGZO, aluminum (Al), and an aluminum alloy, or a laminated film composed of two or more layers of these materials. Examples of the aluminum alloy include aluminum-neodymium alloy.

In the display device 1 of the present embodiment, in the case where the display layer 13 is configured of an organic EL device, for example, the pixel driving circuit includes a driving transistor Tr1, a writing transistor Tr2, a capacitor (retention capacitance) Cs between the transistors Tr1 and Tr2, and a display element configuring each pixel serially-connected to the driving transistor Tr1 between a first power-source line (Vcc) and a second power-source line (GND) as illustrated in FIG. 8A. In addition, in the case where the display layer 13 is configured of an electrophoretic device, a pixel circuit as illustrated in FIG. 8B is provided.

In the pixel driving circuit, as illustrated in FIG. 3 for example, the signal lines 4 are disposed in a column direction, and the scan lines 5 are disposed in a row direction. The intersection of the signal line 4 and the scan line 5 corresponds to the display element. The signal lines 4 are connected to the signal line driving circuit 7A provided on the flexible printed substrate (FPC), and an image signal is supplied from the signal line driving circuit 7A to a source electrode of the writing transistor Tr2 via the signal lines 4. The scan lines 5 are connected to the scan line driving circuit 7B provided on the FPC similarly to the signal line driving circuit 7A, and a scanning signal is sequentially supplied from the scan line driving circuit 7B to a gate electrode of the writing transistor Tr2 via the scan lines 5.

In the scan lines 5 of the present embodiment, the scan lines 5A provided on the front face of the substrate 11 are connected to the scan lines 5B provided on the rear face of the substrate 11 through the penetrating electrode 5C formed in the peripheral region 3, and are pulled out in the direction same as that of the signal lines 4.

The display device 1 is manufactured as follows, for example. It is to be noted that, in the following description of the manufacturing process, the substrate 11 is configured of a substrate having flexibility.

(1-2) Manufacturing Method

Figure 9:
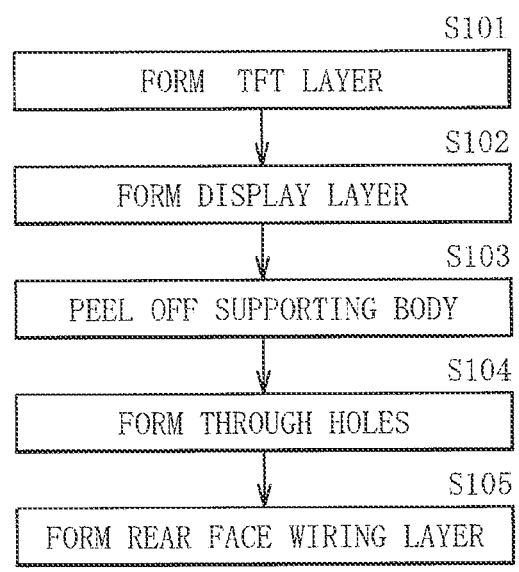
FIG. 9 is a flow chart of a manufacturing method of the display device illustrated in FIG. 1.
Figure 10A:
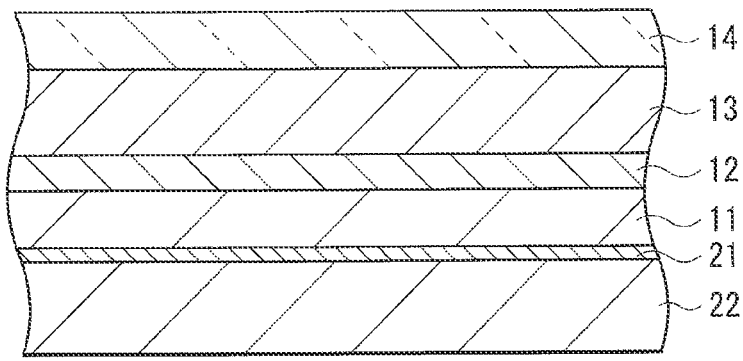
FIGS. 10A to 10D are diagrams showing manufacturing processes of the display device illustrated in FIG. 1.

FIG. 9 shows a flow of the manufacturing method of the display device 1. First, as illustrated in FIG. 10A, a supporting body 22 is bonded to the rear face of the substrate 11 through a fix layer 21, and thereafter the TFT layer 12 and the display layer 13 are formed (steps S101 and S102). The supporting body 22 is configured to support the substrate 11, and may be configured of a glass substrate or a metal substrate, for example. The fix layer 21 is configured to fix the substrate 11 on the supporting body 22. The fix layer 21 may be configured of a versatile adhesive or a versatile adhesive tape. Specifically, it is possible to use, for example, an acrylic adhesive agent (adhesive), an epoxy adhesive agent, a siloxane adhesive agent, a urethane adhesive agent, a silane coupling agent, a natural rubber-based adhesive agent, a synthetic rubber adhesive agent, or the like. The adhesive agent is applied and formed on a contact face between the supporting body 22 and the substrate 11 by a printing method such as spin coating, die coating, and gravure coating. In addition, in the case where the adhesive tape is used, for example, the adhesive tape is attached on the supporting body 22 to form the fix layer 21, and thereafter the substrate 11 is fixed by a laminator.

Next, the TFT layer 12 including various kinds of devices including the TFT, the front face wiring layer (the signal lines 4, the scan lines 5A, and the like), and the like is formed by photolithography or the like. Then, for example, the display layer 13 is formed on the TFT layer 12 by photolithographic technique similarly to the TFT layer 12. Thereafter, the transparent substrate 14 including a common electrode, a moisture-proof film, an optical functional film, and the like is bonded on the display layer 13. It is also possible to form the moisture-proof film and the optical functional film on the transparent substrate 14 after the transparent substrate 14 in which the common electrode is formed is bonded to the display layer 13.

Figure 10B:
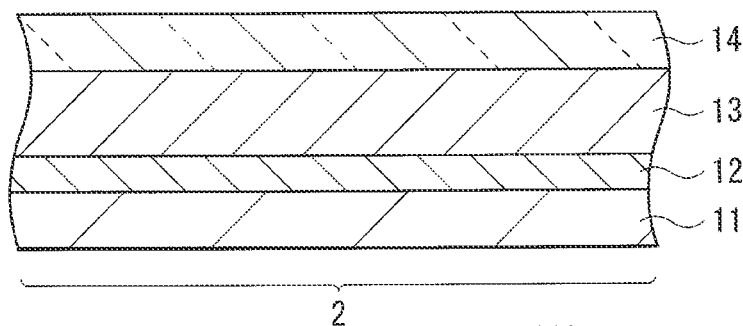

Then, the supporting body 22 is peeled off from the substrate 11 (step S103) as illustrated in FIG. 10B. As the method for separating the supporting body 22 from the substrate 11, for example, it is also possible to provide a picking tape at a place from which the peeling off is to be started. It is to be noted that the fix layer 21 may be kept attached to the substrate 11, or may be removed as necessary.

Figure 10C:
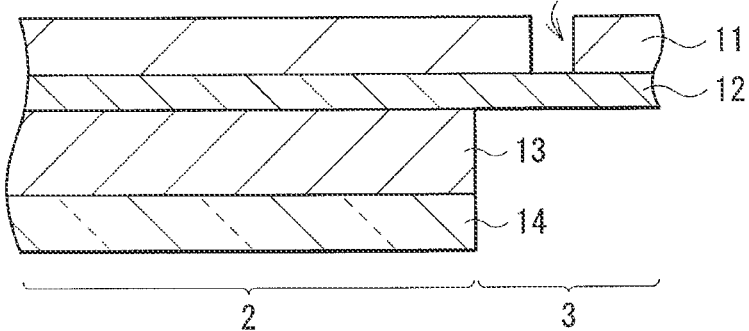

Next, as illustrated in FIG. 10C, the substrate 11 is turned over so that the rear face side thereof becomes the top face, and the through holes 11A are formed (step S104). The method for forming the through holes 11A includes, specifically, processing with use of a $CO_2$ laser and processing with use of a boring machine. In addition, the through holes 11A may be formed by locally applying a solvent for dissolving the substrate 11 by an ink-jet method or a dispenser. It is to be noted that, while the through holes 11A are formed in a state where the rear face side of the substrate 11 is the top face in this instance, the substrate 11 is not necessarily turned over as long as the processing may be performed on the rear face.

Figure 10D:
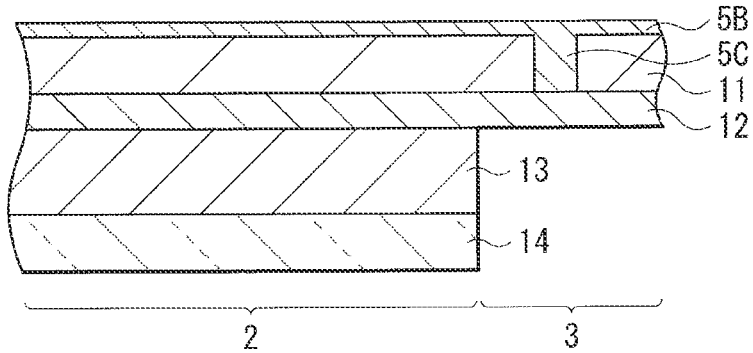

Then, as illustrated in FIG. 10D, the rear face wiring layer (the scan lines 5B) is formed on the rear face of the substrate 11 (step S105). As the method for forming the rear face wiring layer, it is possible to use, for example, printing methods such as an ink-jet method, a spin coating method, a slit coating method, a screen printing method, an offset printing method, a flexo printing method, a gravure printing method, and a relief printing method, spray coating, and the like. It is to be noted that the width and the interval of the wirings are sufficient to be, for example, L/S=30 μm/30 μm to 20 μm/20 μm.

Finally, the signal lines 4 pulled out in the long side direction of the front face of the substrate 11 and the scan lines 5B pulled out in the long side direction of the rear face are electrically connected respectively to the FPC including the signal line driving circuit 7A and the scan line driving circuit 7B by, for example, heat pressure bonding at the wiring pull out section. In this way, the display device 1 is completed. In addition, these driving circuits are not necessarily connected via the FPC, and may be mounted on a chip provided in the long side direction to be electrically connected at the wiring pull out section.

In the display device 1, a scanning signal is supplied from the scan line driving circuit 7B to each pixel 10A via the gate electrode of the writing transistor Tr2, and an image signal supplied from the signal line driving circuit 7A via the writing transistor Tr2 is held in the capacitor Cs. That is, the driving transistor Tr1 is turned on or off according to the signal held in the capacitor Cs, and in this way, the display element is controlled.

In the display device 1 of the present embodiment, the rear face wiring is formed on the rear face of the substrate 11, and the rear face wiring and the wiring (here, the scan lines 5A) configuring the pixel driving circuit provided on the front face of the substrate 11 are electrically connected, and thus, it is possible to put the direction that the wirings are pulled out into one direction. Consequently, the degree of freedom of the design of wiring is improved, allowing the simplification of the pattern of the wiring provided in the peripheral region 3. That is, the frame is allowed to be narrowed, and flexibility of the module as a whole is achieved in the case of a display device employing a substrate having flexibility. In the following, this point is further described.

Figure 11:
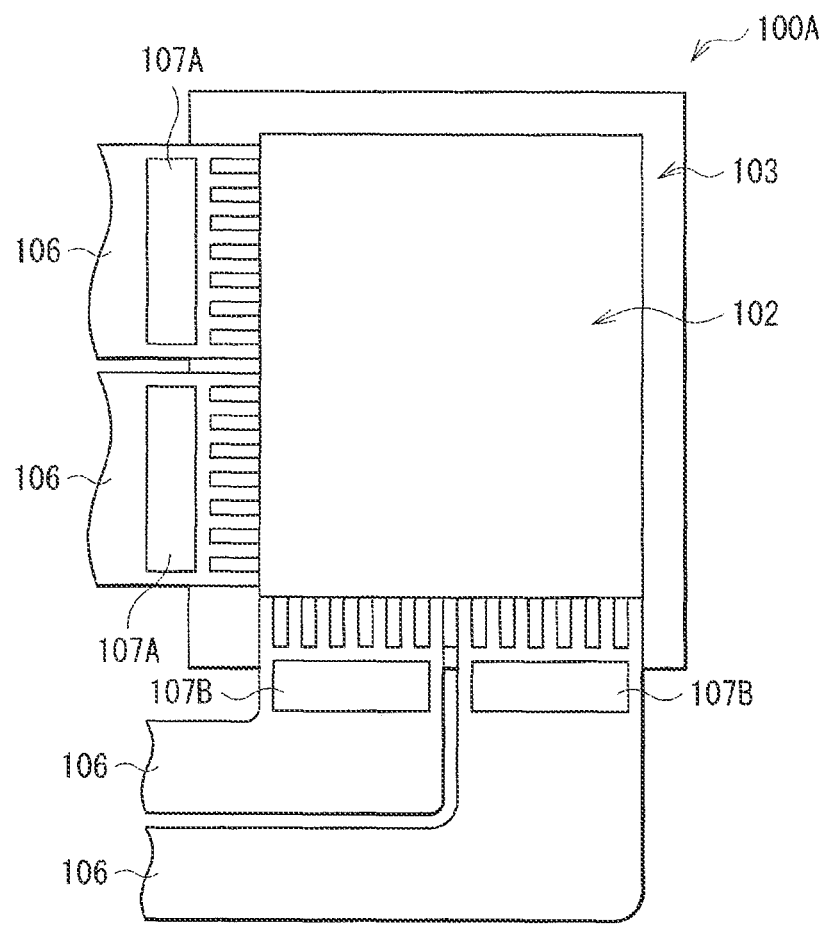
FIG. 11 is a plan view showing a configuration of a display device of related-art example 1.

FIG. 11 shows a plan configuration of a known display module (a display device 100A). In the display device 100A, a plurality of wirings (the signal lines 104 and the scan lines 105) disposed in a row direction and a column direction in a display region 102 are extended in the same directions, and pulled out to the outside from two directions of a rectangular substrate 111. The signal lines 104 and the scan lines 105 are respectively connected to a FPC 106 on which driver ICs including a signal line driving circuit 107A and a scan line driving circuit 107B are mounted. With such a display device 100A, even if a substrate having flexibility is used as the substrate 111, the flexibility of the module may be hindered due to the FPC 106 and the driver ICs connected to two sides of the rectangular substrate 111.

Figure 12:
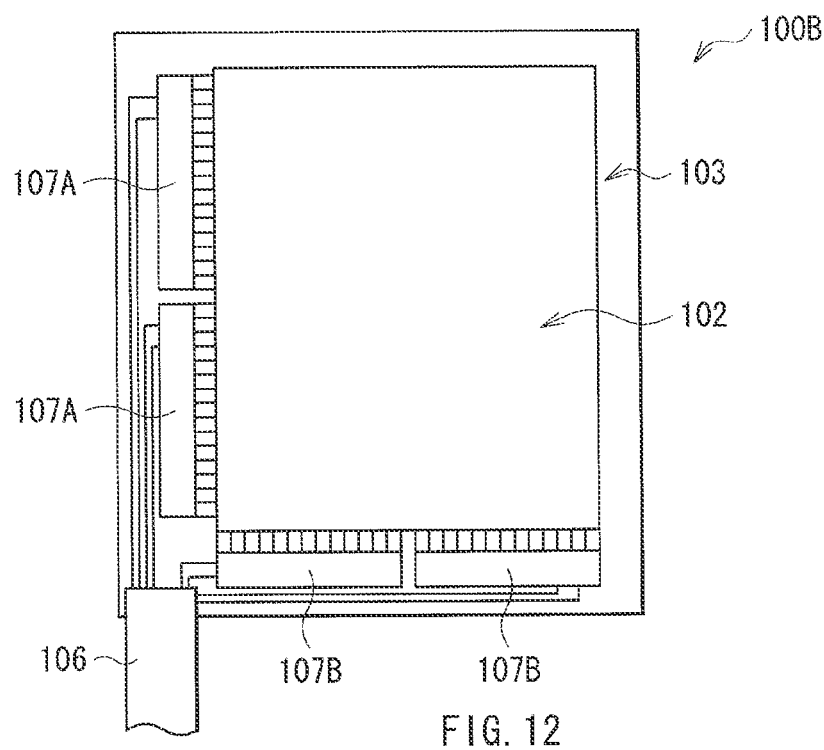
FIG. 12 is a plan view showing a configuration of a display device of related-art example 2.
Figure 13:
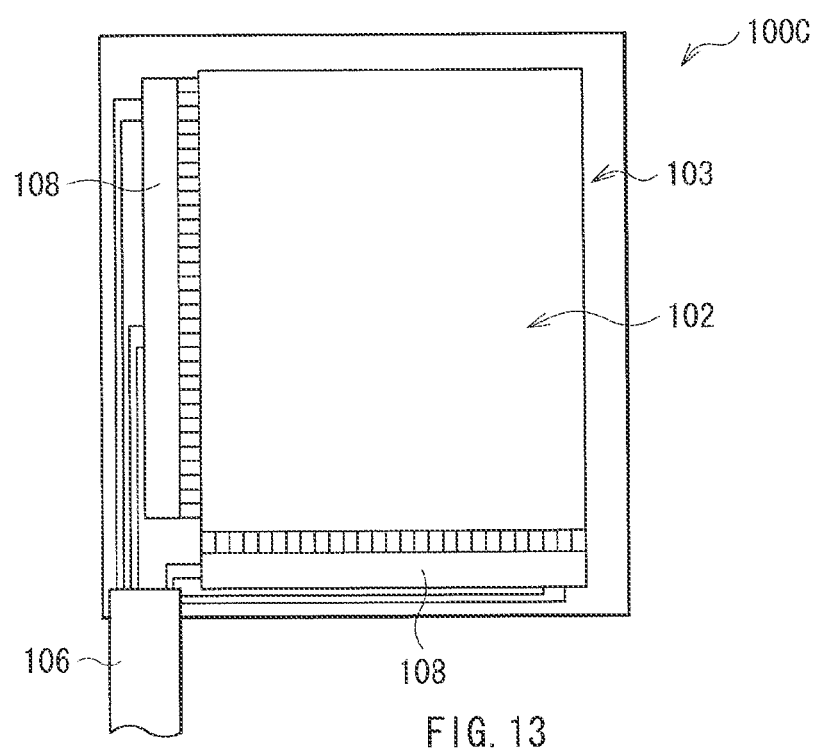
FIG. 13 is a plan view showing a configuration of a display device of related-art example 3.

In order to solve this issue, display devices 100B and 100C illustrated in FIG. 12 and FIG. 13 as described above are reported. In the display device 100B, the driver ICs including the signal line driving circuit 107A and the scan line driving circuit 107B are directly mounted (chip mounting) in a peripheral region 103 of the substrate 111, and in this way, the number of wirings to be pulled out is reduced. On the other hand, in the display device 100C, a driver 108 (built-in circuit) of the TFT which is typically formed in the display region 102 is formed in the peripheral region 103 of the substrate 111, and similarly to the display device 100B, the number of wirings to be pulled out is reduced. In this way, it is possible to put the positions at which the wirings are pulled out to the outside of the display panel into one position, so as to reduce the hindrance to the flexibility of the module due to the driver ICs (the signal line driving circuit 107A and the scan line driving circuit 107B) and the FPC 106. However, in the display devices 100B and 100C of such configurations, it is necessary to form in the peripheral region 103 the wirings pulled out to the outside from the driver 108 and the drivers ICs 107A and 107B mounted on the substrate 111. For this reason, it is necessary to widen at least a portion of the peripheral region 103 in which the driver ICs 107A and 107B and the drivers are provided, and therefore the frame region (peripheral region 103) may be widened. In addition, the position of the display region 102 in the display panel is imbalanced, causing an issue that design property as a display is impaired. Further, since the chip mounting is typically carried out by soldering which entails heating at 200° C. or more, in the case where a flexible substrate made of plastic or the like is used as the substrate 111, dissolution, deformation, or the like of the substrate may be caused. In addition, if a driver including the TFT is mounted on the substrate 111 in a mixed manner as in the case of the display device 100C, then high TFT mobility is necessitated. The mobility of an inorganic TFT using poly silicon or the like as a channel is about several tens to several hundreds $cm^2/Vs$, which is high and causes no problem, but currently, the mobility of an organic TFT is about 1 $cm^2/Vs$, which is not sufficient. As described, in the case of the display devices 100B and 100C illustrated in FIG. 12 and FIG. 13, the material which may be utilized as the material of the display device is limited, and in particular, it is difficult to apply the display devices 100B and 100C to a module having flexibility.

In contrast, in the display device 1 according to the present embodiment, one of the pixel driving circuits of the signal lines 4 and the scan lines 5 formed on the front face side of the substrate 11 is laid out on the rear face side of the substrate 11. Consequently, the degree of freedom of the design of the wiring formed in the peripheral region 3 is improved.

As described, since, in the display device 1 according to the present embodiment, the wiring is provided on the rear face of the substrate 11, and the wiring provided on the rear face and the wiring provided on the front face are electrically connected, the degree of freedom of design of the wiring formed on in the peripheral region 3 is improved, and the wirings are allowed to be pulled out to the outside in one direction. Consequently, in the case where the display device 1 is manufactured with use of a substrate having flexibility, it is possible to provide higher flexibility to the display device 1 as a whole. In addition, since the wirings of the display region 2 is simplified, the frame width of the display device 1 is reduced.

2. Application Examples

For example, the above-mentioned display device 1 may be installed in electronic units illustrated in the following application examples 1 to 6.

Application Example 1

Figure 14A:
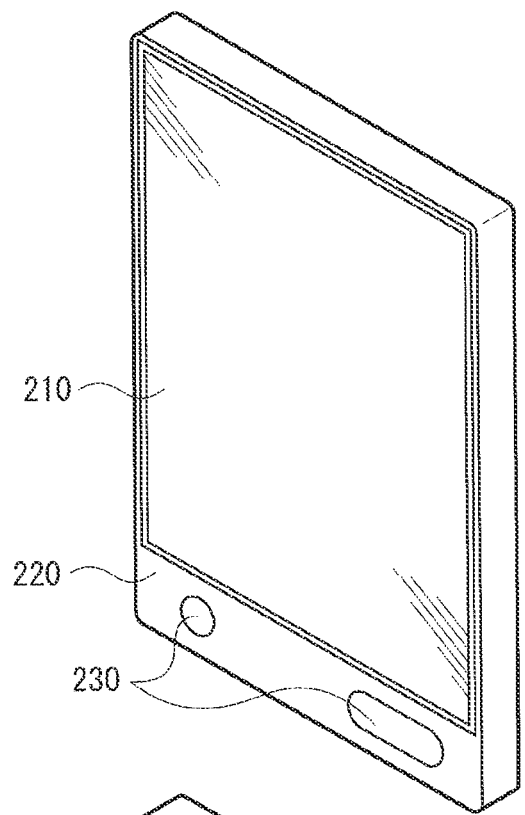
FIGS. 14A and 14B are perspective views each showing an external appearance of application example 1.
Figure 14B:
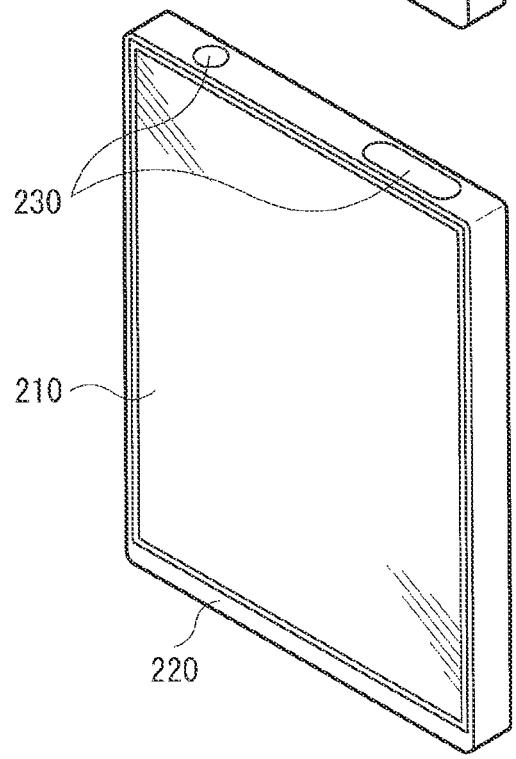

FIG. 14A and FIG. 14B each show an external appearance of an electronic book. This electronic book is provided with, for example, a display region 210, a non-display region 220, and an operation section 230. The operation section 230 may be formed on the same face (front face) as the display region 210 as illustrated in FIG. 14A, or may be formed on a face (top face) different from that of the display region 210 as illustrated in FIG. 14B.

Application Example 2

Figure 15:
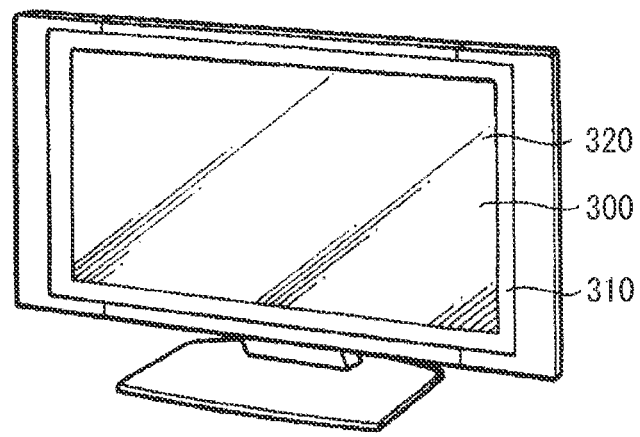
FIG. 15 is a perspective view showing an external appearance of application example 2.

FIG. 15 shows an external appearance of a television. This television is provided with, for example, an image display screen section 300 including a front panel 310 and a filter glass 320.

Application Example 3

Figure 16A:
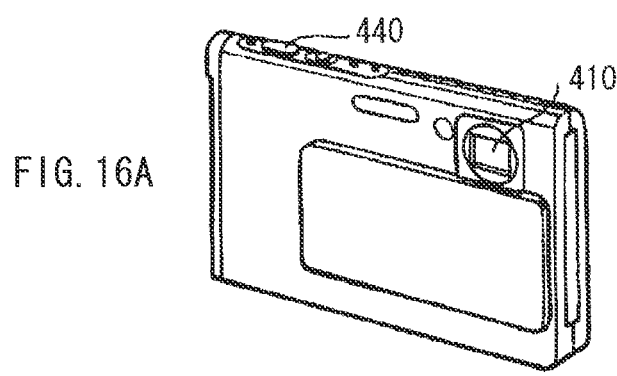
FIG. 16A is a perspective view showing an external appearance of application example 3 as viewed from a front side.
Figure 16B:
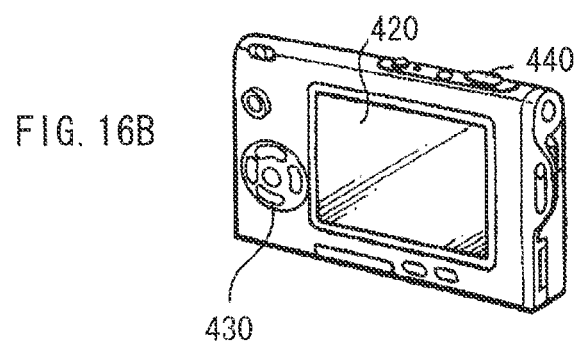
FIG. 16B is a perspective view showing an external appearance thereof as viewed from a rear side.

FIGS. 16A and 16B show an external appearance of a digital still camera. This digital still camera is provided with, for example, a light emitting section 410 for generating flash light, a display region 420, a menu switch 430, and a shutter button 440.

Application Example 4

Figure 17:
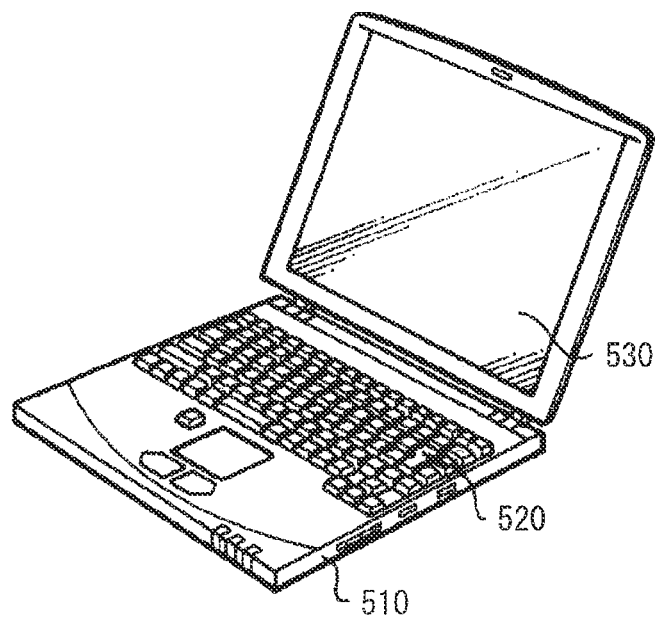
FIG. 17 is a perspective view showing an external appearance of application example 4.

FIG. 17 shows an external appearance of a notebook personal computer. This notebook personal computer is provided with, for example, a main body 510, a keyboard 520 for inputting letters and the like, and a display region 530 for displaying an image.

Application Example 5

Figure 18:
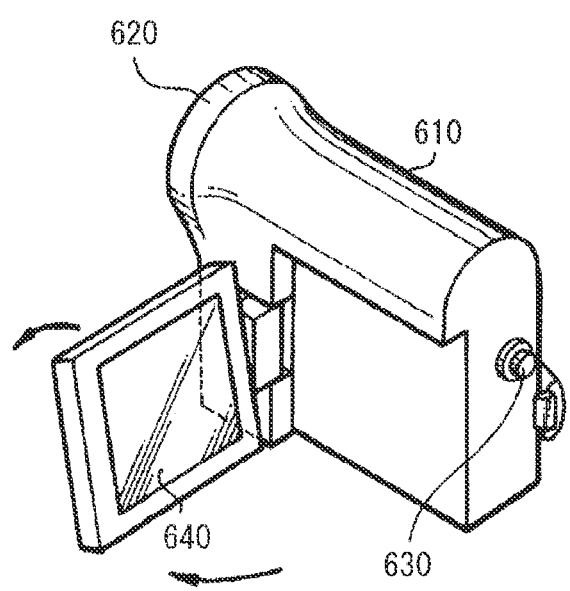
FIG. 18 is a perspective view showing an external appearance of application example 5.

FIG. 18 shows an external appearance of a video camcorder. This video camcorder is provided with, for example, a main body section 610, a lens 620 which is adapted to take an image of a subject and provided on the front side of the main body section 610, a start/stop switch 630 for capturing an image, and a display region 640.

Application Example 6

FIGS. 19A to 19G show an external appearance of a mobile phone. This mobile phone is provided with, for example, an upper side housing 710, a lower side housing 720, a connection section (hinge section) 730 connecting the upper side housing 710 and the lower side housing 720, a display 740, a sub-display 750, a picture light 760, and a camera 770.

While the present technology has been described above with reference to the embodiment and modification, the present technology is not limited to the above-mentioned embodiment and so forth, and various modifications may be made. For example, while the display layer 13 is configured of an electrophoretic display body in the above-mentioned embodiment and so forth, the display layer 13 may also be configured of a liquid crystal, an organic EL (electroluminescence), an inorganic EL, or the like.

In addition, while an exemplary case where the diameter size of the through holes 11A is the same between the front face side and the rear face side is illustrated in FIG. 1, the diameter size may be different between the front face side and the rear face side, and a plurality of the through holes 11A may have the same diameter or different diameters.

Further, the material and the thickness of each layer, the film formation method, the film formation condition, and the like described in the above-mentioned embodiment and so forth are not limitative, and other material and thickness, film formation method, and film formation condition are also applicable.

Further, while the configuration of the display device 1 is specifically described in the above-mentioned embodiment and so forth, it is not absolutely necessary to include all of the layers, and other layer may be additionally included.

It is possible to achieve at least the following configurations from the above-described exemplary embodiments and the modifications of the disclosure.

(1) A display device including:
 a substrate including a display region and a peripheral region;
 a first wiring provided on a front face of the substrate; and
 a second wiring provided on a rear face of the substrate and electrically connected to the first wiring.

(2) The display device according to (1), wherein the first wiring and the second wiring are connected to each other via a connecting section provided in the peripheral region of the substrate.

(3) The display device according to (2), wherein the connecting section is configured of one, or two or more through holes.

(4) The display device according to any one of (1) to (3), wherein
 the first wiring is configured of a plurality of wirings connected to the display region, and
 the second wiring is configured of a plurality of wirings each electrically connected to the first wiring.

(5) The display device according to any one of (1) to (4), wherein
 the substrate has a rectangular shape, and
 the first wiring is connected to the second wiring via a through hole provided along one or more sides of the substrate.

(6) The display device according to any one of (1) to (5), wherein
 the first wiring is connected to the display region on the front face of the substrate,
 a first end of the second wiring is electrically connected at a first side of the substrate to the first wiring via a connecting section, and
 a second end of the second wiring is extended to a wiring pull out section provided at a second side of the substrate.

(7) The display device according to any one of (1) to (6), wherein
 the display region includes
 a plurality of signal lines provided in a row direction,
 a plurality of scan lines provided in a column direction, and
 pixels provided at intersections of the signal lines and the scan lines, and
 the first wiring is connected to either the signal lines or the scan lines.

(8) The display device according to (7), wherein
the signal lines are electrically connected to a signal line driving circuit, and
the scan lines are electrically connected to a scan line driving circuit.
(9) The display device according to (8), wherein
either the signal lines or the scan lines are connected to a wiring pull out section via the first wiring, a connecting section, and the second wiring, and
the wiring pull out section is electrically connected to the signal line driving circuit or the scan line driving circuit.
(10) The display device according to (8) or (9), wherein the signal line driving circuit and the scan line driving circuit are provided at the same side of the substrate having a rectangular shape.
(11) The display device according to any one of (8) to (10), wherein the signal line driving circuit and the scan line driving circuit are provided at a side, of the substrate having a rectangular shape, provided with a wiring pull out section.
(12) The display device according to any one of (8) to (11), wherein the signal line driving circuit and the scan line driving circuit are respectively provided at sides facing each other of the substrate having a rectangular shape.
(13) The display device according to any one of (8) to (12), wherein
one of the signal line driving circuit and the scan line driving circuit is provided at a first side, of the substrate having a rectangular shape, provided with a wiring pull out section, and
the other of the signal line driving circuit and the scan line driving circuit is provided at a second side facing the first side.
(14) The display device according to any one of (8) to (13), wherein the signal line driving circuit and the scan line driving circuit are provided on a driving circuit substrate.
(15) The display device according to (14), wherein the driving circuit substrate is a flexible printed substrate.
(16) The display device according to any one of (5) to (15), further including:
a third wiring provided on the front face of the substrate in a layer different from a layer of the first wiring, wherein
the third wiring and the second wiring are pulled out from a side of the substrate different from the side provided with the through hole.
(17) The display device according to any one of (1) to (16), wherein the substrate is a flexible substrate.
(18) The display device according to (17), wherein
the flexible substrate has a rectangular shape, and
flexibility in a direction along one side of the flexible substrate is higher than flexibility in a direction along another side of the flexible substrate.
(19) An electronic unit including a display device, the display device including:
a substrate including a display region and a peripheral region;
a first wiring provided on a front face of the substrate; and
a second wiring provided on a rear face of the substrate and electrically connected to the first wiring.

The present disclosure contains subject matter related to that disclosed in Japanese Priority Patent Application JP 2011-175832 filed in the Japan Patent Office on Aug. 11, 2011, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A display device comprising:
a substrate including a display region and a peripheral region;
a first wiring provided on a front face of the substrate;
a second wiring provided on a rear face of the substrate; and
at least one penetrating electrode,
wherein the peripheral region includes a connecting section having at least one through hole formed therethrough and
wherein the at least one penetrating electrode is disposed in and extends through the at least one through hole in a close-fitting relationship to interconnect the first and second wirings thereby electrically connecting the first and second wirings.
2. The display device according to claim 1, wherein the connecting section is configured of one, or two or more through holes.
3. The display device according to claim 1, wherein
the first wiring is configured of a plurality of wirings connected to the display region, and
the second wiring is configured of a plurality of wirings each electrically connected to the first wiring.
4. The display device according to claim 1, wherein
the substrate has a rectangular shape, and
the first wiring is connected to the second wiring via a through hole provided along one or more sides of the substrate.
5. The display device according to claim 4, further comprising
a third wiring provided on the front face of the substrate in a layer different from a layer of the first wiring, wherein
the third wiring and the second wiring are pulled out from a side of the substrate different from the side provided with the through hole.
6. The display device according to claim 1, wherein the substrate is a flexible substrate.
7. The display device according to claim 6, wherein
the flexible substrate has a rectangular shape, and
flexibility in a direction along one side of the flexible substrate is higher than flexibility in a direction along another side of the flexible substrate.
8. A display device comprising:
a substrate including a display region and a peripheral region;
a first wiring provided on a front face of the substrate; and
a second wiring provided on a rear face of the substrate and electrically connected to the first wiring, wherein
the first wiring is connected to the display region on the front face of the substrate,
a first end of the second wiring is electrically connected at a first side of the substrate to the first wiring via a connecting section, and
a second end of the second wiring is extended to a wiring pull out section provided at a second side of the substrate.
9. The display device according to claim 1, wherein
the display region includes
a plurality of signal lines provided in a row direction,
a plurality of scan lines provided in a column direction, and
pixels provided at intersections of the signal lines and the scan lines, and
the first wiring is connected to either the signal lines or the scan lines.
10. The display device according to claim 9, wherein
the signal lines are electrically connected to a signal line driving circuit, and the scan lines are electrically connected to a scan line driving circuit.

11. The display device according to claim 10, wherein
either the signal lines or the scan lines are connected to a wiring pull out section via the first wiring, a connecting section, and the second wiring, and
the wiring pull out section is electrically connected to the signal line driving circuit or the scan line driving circuit.

12. The display device according to claim 10, wherein the signal line driving circuit and the scan line driving circuit are provided at the same side of the substrate having a rectangular shape.

13. The display device according to claim 10, wherein the signal line driving circuit and the scan line driving circuit are provided at a side, of the substrate having a rectangular shape, provided with a wiring pull out section.

14. The display device according to claim 10, wherein the signal line driving circuit and the scan line driving circuit are respectively provided at sides facing each other of the substrate having a rectangular shape.

15. The display device according to claim 10, wherein
one of the signal line driving circuit and the scan line driving circuit is provided at a first side, of the substrate having a rectangular shape, provided with a wiring pull out section, and
the other of the signal line driving circuit and the scan line driving circuit is provided at a second side facing the first side.

16. The display device according to claim 10, wherein the signal line driving circuit and the scan line driving circuit are provided on a driving circuit substrate.

17. The display device according to claim 14, wherein the driving circuit substrate is a flexible printed substrate.

18. An electronic unit including a display device, the display device comprising:
a substrate including a display region and a peripheral region;
a first wiring provided on a front face of the substrate; and
a second wiring provided on a rear face of the substrate and electrically connected to the first wiring, wherein
the first wiring is connected to the display region on the front face of the substrate,
a first end of the second wiring is electrically connected at a first side of the substrate to the first wiring via a connecting section, and
a second end of the second wiring is extended to a wiring pull out section provided at a second side of the substrate.

* * * * *